United States Patent [19]

Blocker, III

[11] 4,092,660

[45] May 30, 1978

[54] HIGH POWER FIELD EFFECT TRANSISTOR

[75] Inventor: Truman G. Blocker, III, Richardson, Tex.

[73] Assignee: Texas Instruments Incorporated, Dallas, Tex.

[21] Appl. No.: 506,635

[22] Filed: Sep. 16, 1974

[51] Int. Cl.² ................ H01L 29/78; H01L 29/48; H01L 29/06

[52] U.S. Cl. ................................ 357/22; 357/15; 357/55; 357/56; 357/91

[58] Field of Search ............... 357/22, 15, 55, 56, 357/29, 49

[56] References Cited

U.S. PATENT DOCUMENTS

| | | | |
|---|---|---|---|
| 2,985,805 | 5/1961 | Nelson | 357/22 |
| 2,993,998 | 7/1961 | Lehovec | 357/22 |
| 3,675,313 | 7/1972 | Driver et al. | 357/22 |
| 3,775,200 | 11/1973 | Nobel et al. | 357/15 |
| 3,813,585 | 5/1974 | Tarui et al. | 357/22 |
| 3,855,690 | 12/1974 | Kim et al. | 357/56 |

*Primary Examiner*—William D. Larkins
*Assistant Examiner*—Gene M. Munson
*Attorney, Agent, or Firm*—James T. Comfort; René E. Grossman; William E. Hiller

[57] ABSTRACT

A field effect transistor is provided wherein conductive mesas are topped by source and drain electrodes, respectively, and rise out of a semiconductor epitaxial layer onto which there is formed a Schottky barrier layer. A heat sink metal layer backs the barrier layer and forms a gate terminal for control of flow of current between the source and drain electrodes via the epitaxial layer adjacent to the barrier.

4 Claims, 7 Drawing Figures

HIGH POWER FIELD EFFECT TRANSISTOR

This invention relates to a field effect transistor (FET) device of maximum RF power capability and high DC/RF conversion efficiency, and more particularly to an FET having source and drain mesas of a gallium arsenide substrate with a Schottky barrier gate contacting an epitaxial layer from within which the mesas rise.

Gallium arsenide field effect transistors, while satisfactory from a low noise amplifier standpoint, do not lend themselves to high RF power operations nor high DC/RF conversion efficiency. Most of the reasons for such problem areas are associated with the use of semiinsulating gallium arsenide. Two of the most significant reasons are that the thermal conductivity of gallium arsenide is low presenting problems where high power is to be dissipated. Another problem is the very high density of traps in presently available gallium arsenide. This problem gives FETs with lightly doped N+ layers undesirable electric properties which severely limit the DC/RF conversion efficiency. The DC/RF conversion efficiency is a measure of the conversion of direct current power to radio frequency power and thus characterizes the desirability or undesirability of operation of a given structure.

Furthermore, conventional planar approaches in FET structures result in undesirable parasitic resistances between the source and gate and the gate and drain by way of the undepleted or unmodulated portion of the active channel. This effect reduces both power and efficiency. Yet another drawback for conventional planar structures is that present fabrication techniques necessitate an evaporated gate metallization. Previous experience has shown that only plated platinum has proven to be a reliable, low leakage, micro plasma free Schottky barrier on gallium arsenide. The present invention is directed to a system which overcomes the above drawbacks.

In accordance with the present invention, a field effect transistor is provided in which a highly doped gallium arsenide N+ substrate having an N− epitaxial layer on one surface thereof is provided with a Schottky barrier layer on the surface of the epitaxial layer. The substrate is selectively relieved from the surface opposite the epitaxial layer to form mesas arising from within the epitaxial layer. Terminal contacts on the mesas provide for access to source and drain regions. A gate terminal structure leading to the barrier layer provides for access to the gate terminal. The active region is thus in intimate contact with the high thermal conductivity heat sink such as silver or gold forming the terminal structure on the barrier layer. Parasitic resistances are dramatically reduced while enabling the use of a plated platinum Schottky barrier for the gate structure.

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

Figure 1:
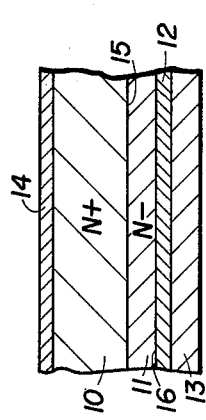
FIG. 1 illustrates the basic elements of structure embodied in the present invention starting with a gallium arsenide substrate.

Referring now to FIG. 1, a sectional view illustrates structure basic to the present invention. A field effect transistor is to be constructed from a heavily doped N+ gallium arsenide substrate 10. Preferably the substrate 10 would at the start of fabrication be from 15 to 20 mils in thickness and ultimately would be thinned to about 10 microns. A carrier concentration of about $10^{18}$ electrons per cubic centimeter is preferred. An epitaxial layer 11 is grown on one surface of the substrate 10 as to have a thickness of about 2 microns and to form an N region. To the bottom face of the epitaxial layer 11 there is provided a platinum layer 12. Layer 12 forms a Schottky barrier for the gate of the resulting FET. The platinum layer 12 is very thin, of the order of 3,000 to 4,000 angstroms. To the layer 12 there is applied a conductive layer 13 preferably of gold or silver and about 10 milinches thick. A contact layer 14 on the face of the substrate 10 opposite the layer 11 is a metallization providing for source and drain terminal contacts.

A field effect transistor of conventional construction normally would have a semiinsulating chromium doped gallium arsenide substrate of resistivity approximating $10^8$ ohm-centimeters. An N epitaxial active region would then be formed on one surface thereof as a thin surface layer. Source metallization and drain metallization making ohmic contact with the surface of the epitaxial layer are normally separated by a Schottky gate electrode which makes ohmic contact with the surface of the epitaxial layer. A voltage controlled depletion region is formed under the gate electrode as to control the flow of current in the epitaxial active region between source and then drain.

In such normal FETs, the source, drain and gate terminals are all formed on the same surface of the device, namely on the exposed surface of the epitaxial active region.

Figure 2:
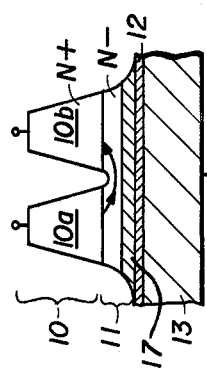
FIG. 2 illustrates mesa FET structure embodying the invention.

In contrast with conventional FET construction, FIG. 2 illustrates the present invention with like parts designated by the same reference characters as in FIG. 1. An N+ conductive substrate 10 is employed. Preferably it will have a resistivity of about 0.01 ohm-centimeters. The N epitaxial active region 11 is then formed on a surface of the substrate 10. A platinum Schottky barrier layer 12 is then established on the surface of the epitaxial layer 11. A thick gold or silver heat sink layer 13 is then formed on the surface of the platinum Schottky barrier 12. Thereafter, the substrate 10 is thinned and etched to form mesas 10a and 10b which form source and drain electrodes. A channel 10c between mesas 10a and 10b extends through the boundary 15. Current flow between the source mesa 10a and the drain mesa 10b is then controlled by the voltage applied to the gate terminal 13a which leads to the heat sink 13. The current flow is restricted to be above the depletion layer 17 of the Schottky barrier 12 and within the conducting channel 10c. By this means, the active region is in intimate contact with the heat sink 13.

Figure 3:
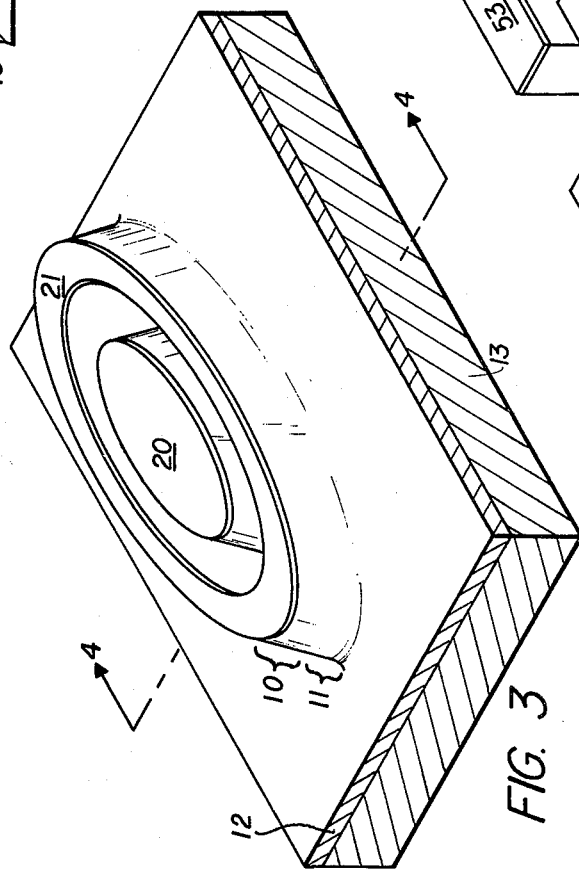
FIG. 3 illustrates an embodiment of the invention wherein a drain mesa encircles a source mesa.

The structure having the configuration shown in FIG. 2 as embodied in a field effect transistor is illustrated in FIG. 3 in which the layers of FIGS. 1 and 2 have been given the same reference characters. It will be seen that two mesas 20 and 21 arise from within the layer 11. That is, in processing after growth of the epitaxial layer 11, application of the Schottky barrier layer 12 and the conductive layer 13, the top surface is relieved selectively to form mesas 20 and 21 of oval or circular configuration. The process of etching the layer 10 is carried on to depths beyond the boundary 15 between layers 10 and 11. Thus, the mesas 20 and 21 arise from within the layer 11. The etching stops short of the boundary 16 between epitaxial layer 11 and the Schottky barrier layer 12. The drain 21 completely surrounds the source 20 in the form shown in FIG. 3.

Figure 4:
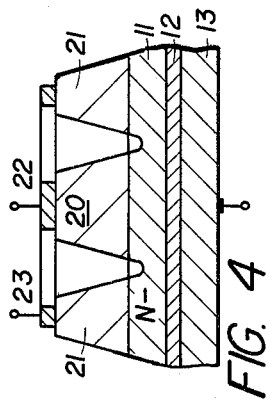
FIG. 4 is a sectional view taken along lines 4—4 of FIG. 3.

FIG. 4 is a sectional view of FIG. 3 wherein the mesa 21 encircles mesa 20 with the electrodes 22 and 23 plated on top of the mesas to form source and drain contacts, respectively. Controlled etching permits the formation of a very thin N portion between the upper surface of the Schottky barrier layer 12 and the bottom of the valleys intermediate the mesas. The active region of the FET is so shaped that it is in intimate contact with the metallization formed by the layers 12 and 13 to provide for highly efficient heat dissipation.

As above noted, a gallium arsenide slice is provided with the epitaxial layer 11 formed thereon following which the platinum layer 12 is applied following which the silver or gold layer 13 is plated on. Thereafter, the gallium arsenide layer 10 is thinned as by mechanical lapping followed by liquid chemical lapping, techniques both well known in the art for production of other devices. Thereafter, the desired device pattern is photo etched selectively to form the mesas whereby the active region of the epitaxial layer 11 is but a few microns thick. The resulting FET structure, depending on the aspect ratio (gate length to gate width) may be etched into the mesas first, then the channel may be selectively etched or the entire shape may be accomplished in a single etching in the cases.

Figure 5:
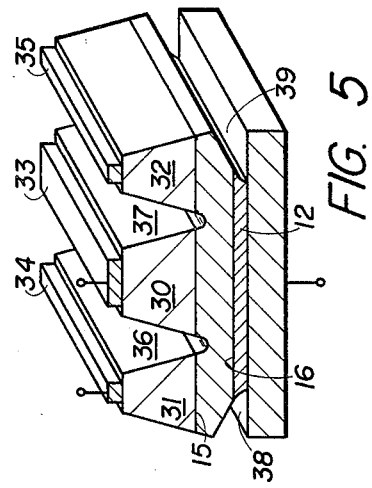
FIG. 5 is an isometric view partially in section illustrating arrangements with the configuration to reduce source-gate capacitance.

In FIG. 5, a parallel mesa structure has been illustrated where the source mesa 30 has drain mesas 31 and 32 on opposite sides thereof with the contacts 33, 34 and 35 topping the mesas to provide for the dual FET structure. The valleys 36 and 37 between the mesas extend below the boundary 15 and do not reach the boundary 16. In this embodiment, the gate-source capacitance is reduced thereby raising the maximum frequency at which the device will operate to a higher level. This is accomplished by using a selective etch at the boundary 16. More particularly, the zones 38 and 39 are etched away to substantially reduce the area of the gate layer 12. The latter etching preferably will be undertaken after the device is mounted in a package. Thus, the linear configuration of FIG. 5 as well as the concentric configuration of FIGS. 3 and 4 may be provided in accordance with the present invention.

Figure 6:
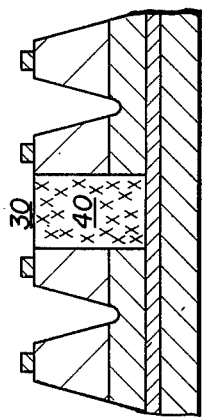
FIG. 6 illustrates a modified structure for minimizing source-gate capacitance.

The system illustrated in FIG. 6 is similar to that of FIG. 5, except that a zone 40 running the length of the mesa 30 is of altered crystal structure, such as by proton bombardment, to convert the N and N+ gallium arsenide in the zone 40 to a semiinsulating material. The altered material would not be electrically active and as a result the source-gate capacitance is greatly reduced.

Figure 7:
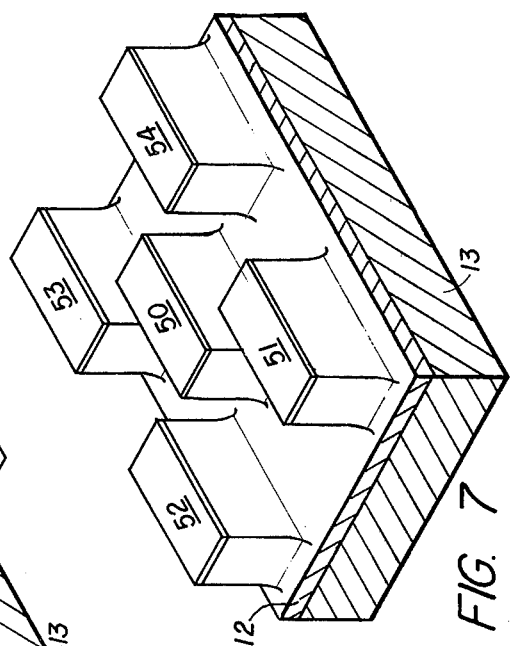
FIG. 7 illustrates a multiple drain structure embodying the present invention.

In FIG. 7 a modified structure is shown wherein a source mesa 50 arising from within the epitaxial layer 11 is surrounded by a plurality of drain mesas 51, 52, 53 and 54. The common gate layer 12 and the conductive metallization 13 serve all of the multiple channels in the system of FIG. 7 while maintaining the desirable aspects of efficient heat dissipation and low gate-source capacitance. Thus, the present invention enables the use of a plated platinum Schottky barrier for the gate with active regions forced into immediate contact with a high thermal conductivity heat sink. The parasitic resistances are dramatically reduced and the necessity for semiinsulating gallium arsenide is eliminated in entirety.

In devices of enhanced current carrying capacities, the aspect ratio (gate width to gate length) of the order of 300 to 1,000 have been achieved using the side by side relationship illustrated in FIG. 5.

Having described the invention in connection with certain specific embodiments thereof, it is to be understood that in the art and it is intended to cover such modifications as fall within the scope of the appended claims.

What is claim is:

1. A field effect transistor comprising:
a gallium arsenide N+ substrate having an N epitaxial layer on one surface thereof,
a Schottky barrier layer on the surface of said epitaxial layer opposite from said substrate,
said substrate being selectively relieved from the other surface thereof opposite from said epitaxial layer to a depth at least commensurate with its junction with said epitaxial layer but short of said barrier layer to define at least two separated mesas above said epitaxial layer and spaced apart by a region including a portion of said epitaxial layer,
terminal contacts on said mesas,
a gate terminal structure connected to said barrier layer, and
said at least two separated mesas serving as a source and as a drain respectively, the mesa serving as the source having a structurally altered electrically inactive central portion thereby to reduce the gate-to-source capacitance.

2. A field effect transistor comprising:
a body of semiconductor material of one type conductivity,
at least two separated mesas of the same semiconductor material as said body and of said one type conductivity, said mesas being disposed on said body and extending outwardly therefrom,
said semiconductor mesas being relatively heavily doped with a conductivity-determining dopant material of said one type conductivity compared to said semiconductor body and being spaced apart by a region including a portion of said body,
a Schottky barrier layer on the surface of said body opposite from said mesas,
terminal contacts on said mesas,
a gate terminal structure connected to said barrier layer, and
said at least two separated mesas serving as a source and as a drain respectively, the mesa serving as the source having a structurally altered electrically inactive central portion thereby to reduce the gate to source capacitance.

3. A field effect transistor comprising:
a body of semiconductor material of one type conductivity,
at least two separated mesas of the same semiconductor material as said body and of said one type conductivily, said mesas being disposed on said body and extending outwardly therefrom, said semiconductor mesas being relatively heavily doped with a conductivity-determining dopant material of said one type conductivity compared to said semiconductor body and being spaced apart by a region including a portion of said body, a Schottky barrier layer on the surface of said body opposite from said mesas, said at least two separated mesas serving as a source and as a drain respectively, terminal contacts on said mesas, a gate terminal structure connected to said barrier layer, the perimeter of said semiconductor body being inwardly bevelled to a depth commensurate with its junction with the barrier layer, and the barrier layer having a perimeter disposed inwardly with respect to the perimeter of said semiconductor body to reduce the gate to source capacitance.

4. A field effect transistor comprising:

a gallium arsenide N+ substrate having an N epitaxial layer on one surface thereof, a Schottky barrier layer on the surface of said epitaxial layer opposite from said substrate, said substrate being selectively relieved from the other surface thereof opposite from said epitaxial layer to a depth at least commensurate with its junction with said epitaxial layer but short of said barrier layer to define at least two separated mesas above said epitaxial layer and spaced apart by a region including a portion said epitaxial layer, said at least two separated mesas serving as a source and as a drain respectively, terminal contacts on said mesas, a gate terminal structure connected to said barrier layer, the perimeter of said epitaxial layer being relieved to a depth commensurate with its junction with the barrier layer, and the barrier layer having a perimeter disposed inwardly with respect to the perimeter of said epitaxial layer to reduce the gate to source capacitance.

* * * * *